(12) United States Patent
Bosnyak

(10) Patent No.: US 7,129,774 B1
(45) Date of Patent: Oct. 31, 2006

(54) METHOD AND APPARATUS FOR GENERATING A REFERENCE SIGNAL

(75) Inventor: Robert J. Bosnyak, Tacoma, WA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/126,585

(22) Filed: May 11, 2005

(51) Int. Cl.
*G05F 3/02* (2006.01)
(52) U.S. Cl. ............... 327/539; 323/313; 327/538
(58) Field of Classification Search ........... 327/539; 323/313
See application file for complete search history.

(56) References Cited

U.S. PATENT DOCUMENTS

| | | | | |
|---|---|---|---|---|
| 5,061,862 A | * | 10/1991 | Tamagawa | 327/541 |
| 5,153,500 A | * | 10/1992 | Yamamoto et al. | 323/314 |
| 5,568,045 A | * | 10/1996 | Koazechi | 323/314 |
| 6,765,431 B1 | * | 7/2004 | Coady | 327/539 |

OTHER PUBLICATIONS

David Johns et al.; "Chapter 7: Comparators"; *Analog Itegrated Circuit Design*; John Wiley & Sons, Inc. 1997; pp. 304-333 (30 pages).
David Johns et al.; "Chapter 8: Sample and Holds, Voltage References, and Translinear Circuits"; *Analog Integrated Circuit Design*; John Wiley & Sons, Inc. 1997; pp. 334-372 (39 pages).
William J. Dally et al.; "Chapter 9: Timing Conventions"; *Digital Systems Engineering*; Cambridge University Press 1998; pp. 395-461 (68 pages).
William J. Dally et al.; "Chapter 10: Synchronization"; *Digital Systems Engineering*; Cambridge University Press 1998; pp. 463-513 (52 pages).
William J. Dally et al.; "Chapter 12: Timing Circuits"; *Digital Systems Engineering*; Cambridge University Press 1998; pp. 574-642 (70 pages).
Behzad Razavi; "Chapter 11: Bandgap References"; *Design of Analog CMOS Integrated Circuits*; McGraw-Hill Companies 1999; pp. 377-404 (28 pages).
Gabriel Alfonso Rincon-Mora; *"Voltage References: From Diodes to Precision High-Order Circuits"*; Wiley US, IEEE Press 2002; (192 pages).

* cited by examiner

*Primary Examiner*—Long Nguyen
*Assistant Examiner*—Ryan Jager
(74) *Attorney, Agent, or Firm*—Osha Liang LLP

(57) ABSTRACT

A method and apparatus for generating a reference signal involves (i) generating a CTAT voltage and a PTAT voltage, (ii) generating a first digital signal and a second digital signal having an amplified difference dependent on a difference between the CTAT voltage and the PTAT voltage, and (iii) dependent on the first digital signal and the second digital signal, adding or subtracting charge from the reference signal, where the reference signals controls the conductivity of devices that drive current through the devices that are used to generate the CTAT and PTAT voltages.

20 Claims, 5 Drawing Sheets

METHOD AND APPARATUS FOR GENERATING A REFERENCE SIGNAL

STATEMENT REGARDING FEDERALLY SPONSORED RESEARCH OR DEVELOPMENT

The present invention was made with the support of the government of the United States under contract NBCH020055 awarded by the Defense Advanced Research Projects Administration. The United States government may have certain rights in the present invention.

BACKGROUND

The operation of an integrated circuit is often dependent on circuits designed to generate a reference signal (e.g., a reference voltage or a reference current). Because behaviors of devices implemented in silicon are susceptible to change with variations in, for example, characteristics of the silicon (i.e., "process" variations), power supply levels, and temperature, designers use circuits known in the art as "bandgap" circuits to generate a reference signal that has little or no dependence on process and power supply level variations and a well-defined dependence on temperature.

The use of at least one family of bandgap circuits to generate a temperature-stable reference signal (i.e., a reference that remains steady over an expected range of temperatures) relies on the properties of bipolar transistor technology. A bipolar transistor, of which there are two types (PNP and NPN), has three regions. The outer two regions are referred to as the "collector" and the "emitter," and the middle region is referred to as the "base." When implemented in silicon, the base-emitter junction voltage of a bipolar transistor is substantially constant (e.g., ~0.7 volts) (such voltage referred to as the "on" voltage). This base-emitter junction voltage has a negative temperature coefficient, i.e., the voltage is complementary to absolute temperature (CTAT). Particularly, the voltage drop between the base and emitter decreases as temperature increases.

In typical bandgap circuits, a pair of bipolar transistors are operated at different current densities and are arranged to develop a voltage that is proportional to the difference in base-emitter junction voltages of the two transistors. This voltage difference has a positive temperature coefficient, i.e., the voltage is proportional to absolute temperature (PTAT). The PTAT voltage provided by the difference in base-emitter junction voltages of the two transistors is appropriately scaled and summed with the CTAT voltage of one of the transistors to produce the reference voltage/current.

FIG. 1 shows a circuit schematic of a typical bandgap circuit 10. In FIG. 1, a first bipolar transistor Q1 is "diode-connected" as its base and collector are both connected to ground. The emitter of transistor Q1 is connected to (i) an input of an operational amplifier 12 and (ii) a terminal of resistance R2. Another terminal of resistance R2 is connected to an output $V_{REF}$ of the operational amplifier 12. Also connected to the output $V_{REF}$ of the operational amplifier 12 is a terminal of resistance R3. Another terminal of resistance R3 is connected to (i) another input of the operational amplifier 12 and (ii) an emitter of a second bipolar transistor Q2 that is "diode-connected" as its base and collector are both connected to ground.

Accordingly, those skilled in the art will note that due to the feedback configuration of operational amplifier 12 in FIG. 1 described above, $V_{REF}$ may be given as:

$$V_{REF} = V_{BEQ2} + \left(\frac{R_2}{R_1}\right) V_T \ln\left(\frac{R_2 A_{EQ1}}{R_3 A_{EQ2}}\right), \quad (1)$$

where $V_{BEQ2}$ represents the base-emitter junction voltage of transistor Q2, $R_1$ represents the value of resistance R1, $R_2$ represents the value of resistance R2, $R_3$ represents the value of resistance R3, $V_T$ represents the threshold voltage, $A_{EQ1}$ represents an area of transistor Q1, and $A_{EQ2}$ represents an area of transistor Q2.

As shown above, those skilled in the art will note that an operational amplifier, such as the one shown in FIG. 1, performs, with electrical signals, mathematical operations such as addition, subtraction, multiplication, division, differentiation, integration, etc. The operational amplifier of a bandgap circuit may be implemented in silicon using transistors and/or capacitors that are deliberately enlarged to increase transconductance and compensate gain. Further, as power supply levels necessary for the proper operation of integrated circuits continue to decrease with advances in technology, designing and implementing an operational amplifier within such power supply level constraints may be difficult.

SUMMARY

According to one aspect of one or more embodiments of the present invention, a computer system comprises: a first circuit configured to generate a CTAT voltage and a PTAT voltage dependent on a reference signal; a second circuit configured to generate a first digital signal and a second digital signal dependent on the CTAT voltage and the PTAT voltage; and a third circuit configured to adjust the reference signal dependent on the first digital signal and the second digital signal.

According to another aspect of one or more embodiments of the present invention, a computer system comprises: a first bipolar device; a second bipolar device, wherein a CTAT voltage and a PTAT voltage are dependent on current flow through the first bipolar device and current flow through the second bipolar device; a digital amplifier having a first input operatively connected to the CTAT voltage and a second input operatively connected to the PTAT voltage, where the digital amplifier is configured to generate a first digital signal and a second digital signal; and a charge pump having a first input operatively connected to the first digital signal and a second input operatively connected to the second digital signal, where the charge pump is configured to adjust a reference signal, and where the current flow through the first bipolar device and the current flow through the second bipolar device is dependent on the reference signal.

According to another aspect of one or more embodiments of the present invention, a method of generating a reference signal comprises: generating a CTAT voltage; generating a PTAT voltage; generating a first digital signal and a second digital signal dependent on the CTAT voltage and the PTAT voltage; and outputting and adjusting the reference signal dependent on the first digital signal and the second digital signal, where generating the CTAT voltage and generating the PTAT voltage are dependent on the reference signal.

According to another aspect of one or more embodiments of the present invention, a method of manufacturing comprises: disposing a first device; disposing a second device, the first device and the second device configured to generate, when in operation, a PTAT voltage on a first disposed wire and a CTAT voltage on a second disposed wire; disposing a first circuit having a first input operatively connected to the first disposed wire and a second input operatively connected to the second disposed wire, where the first circuit is configured to generate, when in operation, a first digital signal on a third disposed wire and a second digital signal on a fourth disposed wire; disposing a second circuit having a first input operatively connected to the third disposed wire and a second input operatively connected to the fourth disposed wire, where the second circuit is configured to generate, when in operation, a reference signal on a fifth disposed wire, where a terminal of the first device and a terminal of the second device are operatively connected to the fifth disposed wire.

Other aspects and advantages of the invention will be apparent from the following description and the appended claims.

DETAILED DESCRIPTION

Figure 1:
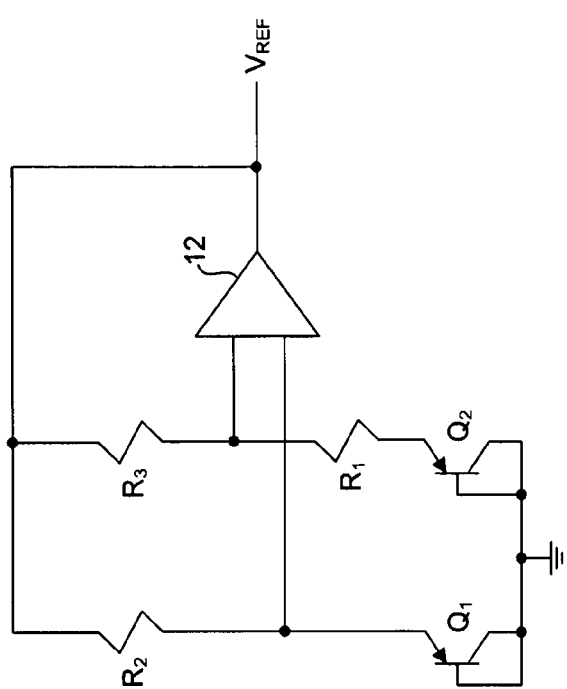
FIG. 1 shows a circuit schematic of a prior art bandgap circuit.

Exemplary embodiments of the present invention will be described with reference to the accompanying drawings. Like items in the drawings are shown with the same reference numbers. Moreover, numerous specific details are set forth in the context of embodiments of the present invention in order to provide a more thorough understanding of the invention. In other instances, well-known features have not been described in detail to avoid obscuring the invention.

Embodiments of the present invention relate to a method and apparatus for generating a reference voltage/current. In one or more embodiments of the present invention, a bandgap circuit is implemented as a closed feedback loop with a circuit that generates digital signals dependent on a difference between generated CTAT and PTAT voltages, where a reference signal is generated and adjusted dependent on the digital signals, and where the CTAT and PTAT voltages are dependent on the reference signal.

Figure 2:
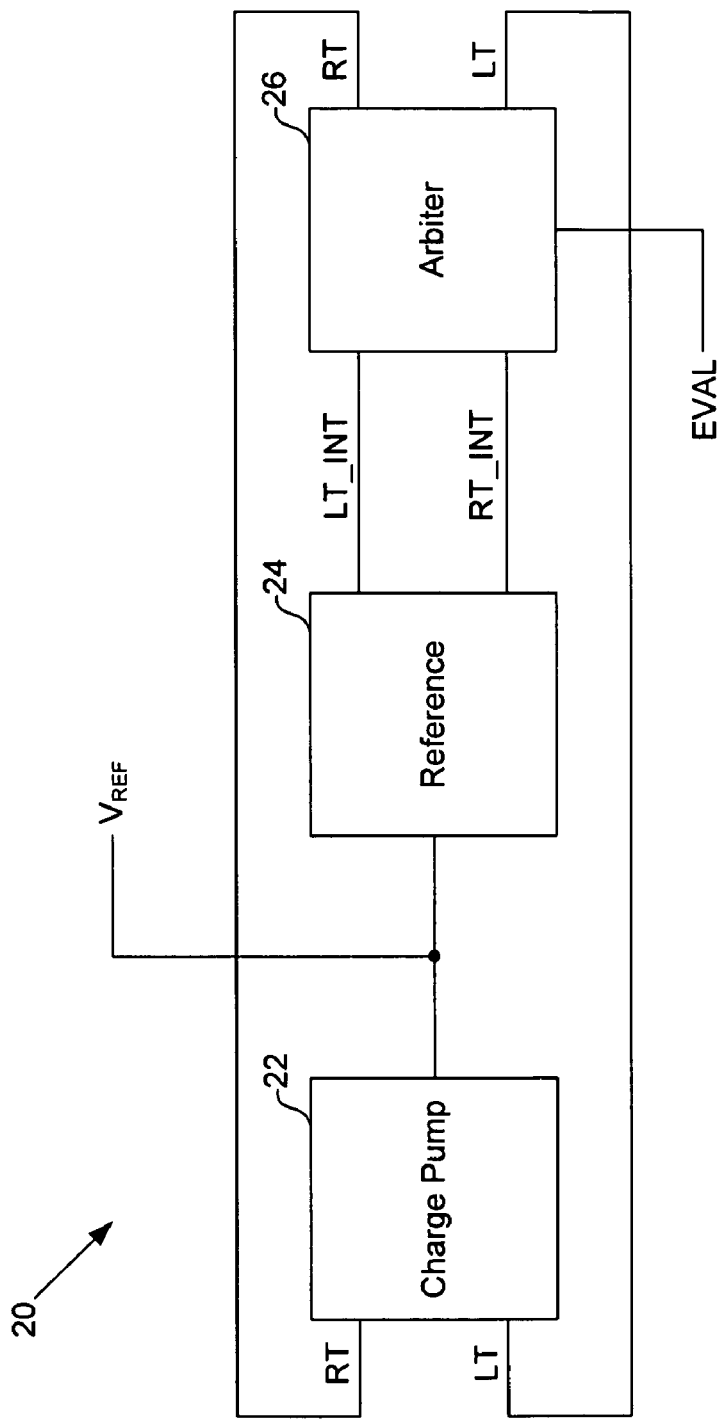
FIG. 2 shows a block diagram of a bandgap circuit in accordance with an embodiment of the present invention.

FIG. 2 shows an exemplary bandgap circuit 20 in accordance with an embodiment of the present invention. The bandgap circuit 20 includes a charge pump 22, a reference block 24, and an arbiter block 26. When in an "evaluation" phase (e.g., when signal EVAL to the arbiter block 26 is asserted "high"), the arbiter block 26 evaluates signals RT_INT, LT_INT at its input (as further described below with reference to FIG. 4) and accordingly outputs signals RT, LT to the charge pump 22. Dependent on signals RT, LT at its input (as further described below with reference to FIG. 5), charge pump 22 adds or subtracts charge from a reference voltage $V_{REF}$. Dependent on reference voltage $V_{REF}$ at its input (as further described below with reference to FIG. 3), reference block 24 adjusts the values of signals RT_INT, LT_INT.

In one or more embodiments of the present invention, a configuration of a bandgap circuit as shown in FIG. 1 results in the generation of a substantially constant reference voltage (e.g., reference voltage $V_{REF}$ in FIG. 1).

Figure 3:
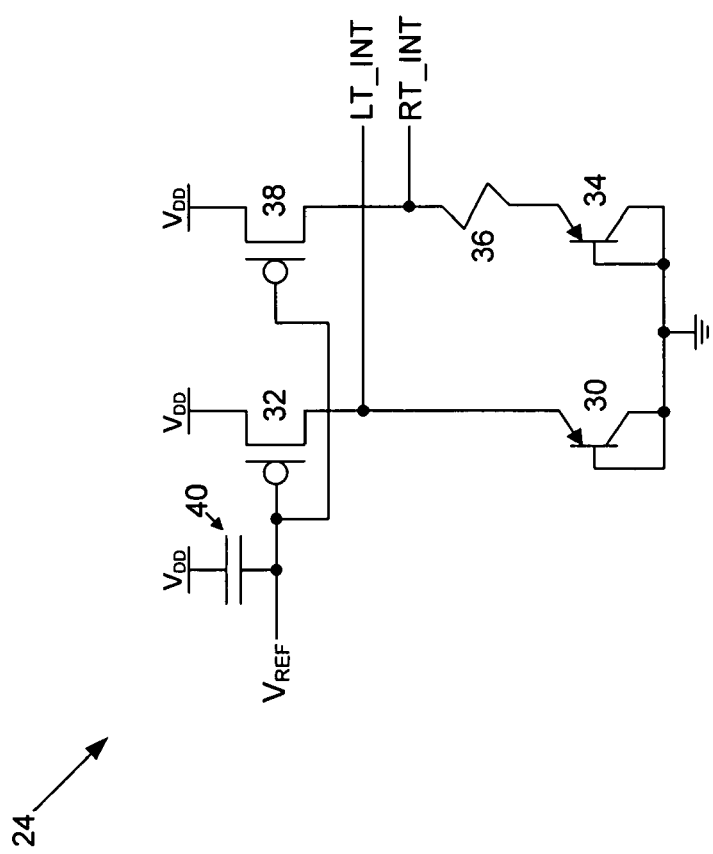
FIG. 3 shows a circuit schematic of a portion of the bandgap circuit shown in FIG. 2.

FIG. 3 shows a circuit schematic of an exemplary reference block 24 usable in the bandgap circuit 20 shown in FIG. 2. In FIG. 3, a first branch includes bipolar transistor 30, which is "diode-connected" as its base and collector are both connected to ground and has an emitter that is connected to (i) signal LT_INT and (ii) a terminal of MOS transistor 32 that has another terminal connected to power $V_{DD}$. A second branch includes bipolar transistor 34, which is "diode-connected" as its base and collector are both connected to ground and has an emitter that is connected to a terminal of resistor 36. Another terminal of resistor 36 is connected to (i) signal RT_INT and (ii) a terminal of MOS transistor 38 that has another terminal connected to power $V_{DD}$.

The inputs to MOS transistors 32, 38 are connected to reference voltage $V_{REF}$. Reference voltage $V_{REF}$ also serves to maintain charge across capacitor 40. Dependent on reference voltage $V_{REF}$, MOS transistors 32, 38 are said to be "on," i.e., conductive, in which case MOS transistors 32, 38 drive current through bipolar transistors 30, 34, respectively. Accordingly, signal LT_INT represents the CTAT voltage and signal RT_INT, due to resistor 36 developing the voltage difference between the base-emitter junctions of bipolar transistors 30, 32, represents the PTAT voltage.

Those skilled in the art will note that in one or more embodiments of the present invention, the areas of transistors 30, 32, 34, 38 and values of resistor 36 and capacitor 40 may be of any value. For example, the area of transistor 34 may be some ratio larger than the area of transistor 30.

Further, those skilled in the art will note that in one or more embodiments of the present invention, quantities of particular devices different from that shown in FIG. 3 may be used. For example, a plurality of bipolar transistors in parallel may be used instead of a single bipolar transistor.

Further, although not shown in FIG. 3, a resistive path may be provided between signal LT_INT and ground and/or between signal RT_INT and ground. Such paths may be used to modulate the temperature coefficient. In one embodiment of the present invention, the resistive paths may be of high resistance, thereby adding a positive, slight temperature coefficient to current.

Further, those skilled in the art will note that in one or more embodiments of the present invention, a CTAT voltage and/or a PTAT voltage may be generated using devices other than bipolar transistors. For example, at least one of a CTAT voltage and a PTAT voltage may be generated using a MOS transistor.

Figure 4:
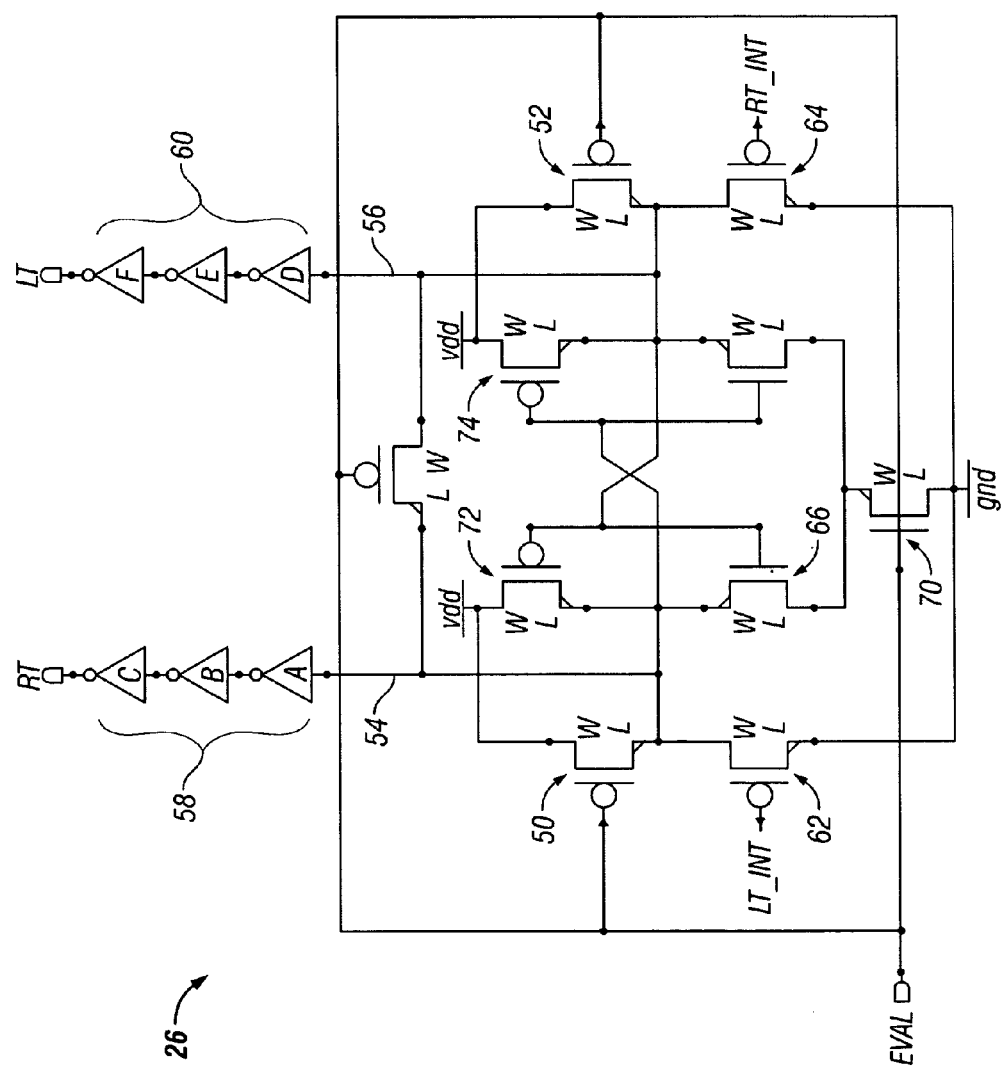
FIG. 4 shows a circuit schematic of a portion of the bandgap circuit shown in FIG. 2.

FIG. 4 shows a circuit schematic of an exemplary arbiter block 26 usable in the bandgap circuit 20 shown in FIG. 2. In FIG. 4, when signal EVAL is "low," MOS transistors 50, 52 are "on," which, in turn, causes nodes 54, 56 to go "high" due to their connection to power $V_{DD}$ through the "on" MOS transistors 50, 52. When nodes 54, 56 are both "high," two chains of inverters 58, 60 each output "low" on signals RT, LT, respectively.

When signal EVAL is "high," the arbiter block 26 is said to be in an "evaluation" phase in which inputs LT_INT, RT_INT are evaluated. Generally, the arbiter block 26 amplifies the difference between LT_INT and RT_INT. During the evaluation phase, depending on which one of MOS transistors 62 and 64 is more conductive due to the values of signals LT_INT, RT_INT, one of MOS transistors 72, 74 conducts more aggressively than the other. For example, if MOS transistor 62 is more conductive than MOS transistor 64, MOS transistor 74, which has a gate input connected to a terminal of MOS transistor 62, conducts more aggressively than MOS transistor 72, which has a gate input connected to a terminal of MOS transistor 64. In this case, MOS transistor 74 drives or keeps node 56 "high," which, in turn, causes MOS transistor 66 to remain conductive and sink current from node 54 to ground via "on" MOS transistor 70, thereby driving node 54 "low." Thus, for values of LT_INT and RT_INT effectuating such behavior, (i) inverter chain 58 inputs the "low" on node 54 and outputs "high" on signal RT, and (ii) inverter chain 60 inputs the "high" on node 56 and outputs "low" on signal LT.

Alternatively, if MOS transistor 64 is more conductive than MOS transistor 62, MOS transistor 72, which has a gate input connected to a terminal of MOS transistor 64, conducts more aggressively than MOS transistor 74, which has a gate input connected to a terminal of MOS transistor 62. In this case, MOS transistor 72 drives or keeps node 54 "high," which, in turn, causes MOS transistor 68 to remain conductive and sink current from node 56 to ground via "on" MOS transistor 70, thereby driving node 56 "low." Thus, for values of LT_INT and RT_INT effectuating such behavior, (i) inverter chain 58 inputs the "high" on node 54 and outputs "low" on signal RT, and (ii) inverter chain 60 inputs the "low" on node 56 and outputs "high" on signal LT.

Accordingly, as shown in FIG. 4 and described above, the arbiter block "senses" the difference between signals LT_INT and RT_INT and amplifies the difference in a manner that results in one of signals LT and RT being "high" and the other "low."

Those skilled in the art will note that in one or more embodiments of the present invention, areas of one or more of the transistors shown in FIG. 4 may be chosen to effectuate particular behavior. For example, in FIG. 4, an area of one of MOS transistors 72 and 74 may be larger than an area of one of MOS transistors 66 and 68.

Further, those skilled in the art will note that in one or more embodiments of the present invention, quantities of particular devices different from that shown in FIG. 4 may be used. For example, in FIG. 4, inverter chain 58 may be formed using five inverters if, for example, more delay is desired in generating signal RT.

Further, those skilled in the art will note that in one or more embodiments of the present invention, signals generated from the arbiter block (e.g., signals LT and RT in FIG. 4) are digital in nature.

Further, those skilled in the art will note that in one or more other embodiments of the present invention, a different circuit topology of different transistors than that shown in FIG. 4 may be used for an arbiter block. Any arbiter block that amplifies a small difference to a logic level may be used in an embodiment of the present invention.

Figure 5:
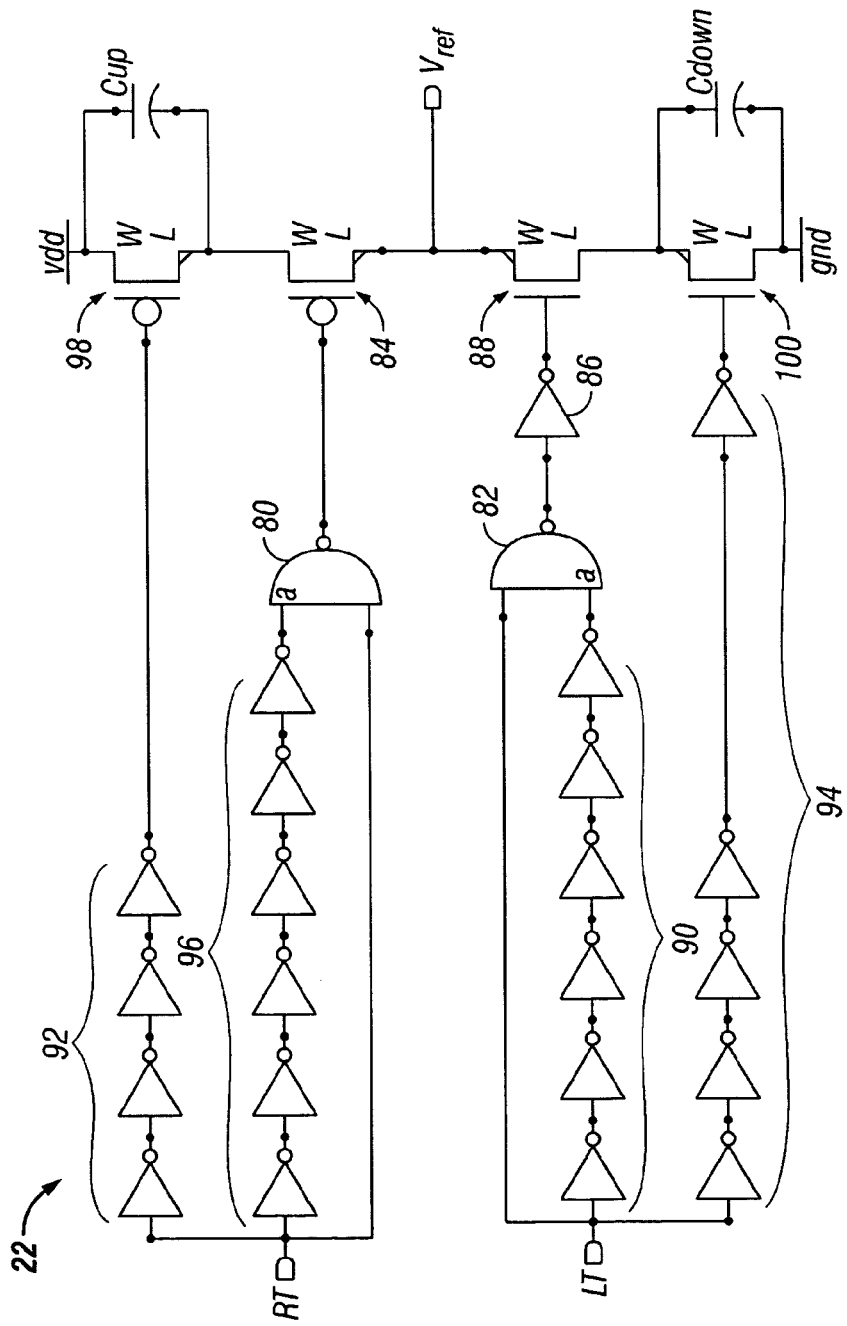
FIG. 5 shows a circuit schematic of a portion of the bandgap circuit shown in FIG. 2.

FIG. 5 shows a circuit schematic of an exemplary charge pump 22 usable in the bandgap circuit 20 shown in FIG. 2. The charge pump 22 inputs signals LT, RT generated from an arbiter block (e.g., that shown in FIG. 4) and selectively connects, via reference voltage $V_{REF}$, one of two capacitors $C_{UP}$, $C_{DOWN}$ to a capacitor (e.g., 40 in FIG. 3) of a reference block (e.g., that shown in FIG. 3). When both signals LT, RT are "low," NAND logic gates 80, 82 output "high." The "high" output of NAND logic gate 80 switches MOS transistor 84 "off," thereby disconnecting capacitor $C_{UP}$ from reference voltage $V_{REF}$. The "high" output of NAND logic gate 82 is inverted by inverter 86, which, in turn, switches MOS transistor 88 "off," thereby disconnecting capacitor $C_{DOWN}$ from reference voltage $V_{REF}$.

Further, when both signals LT, RT are "low," (i) MOS transistor 98 switches "on" (after a delay of inverter chain 92) and (ii) MOS transistor 100 switches "on" (after a delay of inverter chain 94). When MOS transistor 98 is "on," capacitor $C_{UP}$ is discharged. When MOS transistor 100 is "on," capacitor $C_{DOWN}$ is discharged.

If signal LT is "high" and signal RT is "low," NAND logic gate 82 outputs "low" (after a delay of inverter chain 90) to inverter 86, which, in turn, switches MOS transistor 88 "on." With MOS transistor 88 "on," charge is shared between (i) a capacitor (e.g., 40 in FIG. 3) of a reference block (e.g., that shown in FIG. 3) connected to reference voltage $V_{REF}$ and (ii) capacitor $C_{DOWN}$ connected to reference voltage $V_{REF}$. Thus, in this case, there is some loss of charge in the capacitor (e.g., 40 in FIG. 3). Further, in this case, capacitor $C_{UP}$ remains disconnected from reference voltage $V_{REF}$ due to MOS transistor 84 being effectively switched "off" by the "low" on signal RT.

Alternatively, if signal LT is "low" and signal RT is "high," NAND logic gate 80 outputs "low" (after a delay of inverter chain 96), which, in turn, switches MOS transistor 84 "on." With MOS transistor 84 "on," a total charge is shared between (i) a capacitor (e.g., 40 in FIG. 3) of a reference block (e.g., that shown in FIG. 3) connected to reference voltage $V_{REF}$ and (ii) capacitor $C_{UP}$ connected to reference voltage $V_{REF}$. Thus, in this case, there is some increase in the charge of the capacitor (e.g., 40 in FIG. 3). Further, in this case, capacitor $C_{DOWN}$ remains disconnected from reference voltage $V_{REF}$ due to MOS transistor 88 being effectively switched "off" by the "low" on signal LT.

Those skilled in the art will note that in one or more embodiments of the present invention, areas of one or more of the transistors shown in FIG. 5 may be chosen to effectuate particular behavior.

Further, those skilled in the art will note that in one or more embodiments of the present invention, quantities of particular devices different from that shown in FIG. 5 may be used.

Further, those skilled in the art will note that in one or more other embodiments of the present invention, a different circuit topology of different transistors than that shown in FIG. 5 may be used for a charge pump.

Accordingly, a bandgap circuit in accordance with one or more embodiments of the present invention generates a reference voltage by (i) generating a CTAT voltage (e.g., LT_INT in FIG. 3) and a PTAT voltage (e.g., RT_INT in FIG. 3), (ii) generating a first digital signal (e.g., RT in FIG. 4) and a second digital signal (e.g., LT in FIG. 4) having an amplified difference dependent on a difference between the CTAT voltage and the PTAT voltage, and (iii) dependent on the first digital signal and the second digital signal, adding or subtracting charge from a reference voltage (e.g., reference voltage $V_{REF}$ in FIGS. 3 and 5), where the reference voltage controls the conductivity of devices that drive current through the devices (e.g., bipolar transistors 30, 34 in FIG. 3) that are used to generate the CTAT and PTAT voltages. In such a manner, a bandgap circuit in accordance with one or more embodiments of the present invention is implemented as a closed feedback loop.

In one or more embodiments of the present invention, using the bandgap circuit 10 shown in FIG. 2 and the exemplary portions thereof shown in FIGS. 3–5, a reference voltage may be generated without being dependent on an operational amplifier.

Further, in one or more embodiments of the present invention, a bandgap circuit is implemented with an arbiter circuit that is digital in nature.

Further, in one or more embodiments of the present invention, a bandgap circuit is implemented with an arbiter circuit that is capable of operating at low power supply levels.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer system, comprising:
   a first circuit configured to generate a CTAT voltage and a PTAT voltage dependent on a reference signal;
   a second circuit configured to generate a first digital signal and a second digital signal dependent on the CTAT voltage and the PTAT voltage; and
   a third circuit configured to adjust the reference signal dependent on the first digital signal and the second digital signal.

2. The computer system of claim 1, wherein the second circuit is further configured to generate the first digital signal and the second digital signal dependent on a difference between the CTAT voltage and the PTAT voltage.

3. The computer system of claim 1, the first circuit comprising:
   a first device; and
   a second device,
   wherein at least one of the first device and the second device is at least one of a bipolar transistor and a MOS transistor.

4. The computer system of claim 3, the first circuit further comprising:
   a capacitor having a charge that is dependent on the reference signal,
   wherein current flow through the first device and current flow through the second device is dependent on the charge.

5. The computer system of claim 3, wherein at least one of the first device and the second device is diode-connected.

6. The computer system of claim 1, the third circuit comprising:
   a first capacitor having a charge dependent on the first digital signal; and
   a second capacitor having a charge dependent on the second digital signal.

7. The computer system of claim 6, wherein charge is lost from a capacitor connected to the reference signal dependent on at least one of the charge of the first capacitor and the charge of the second capacitor.

8. The computer system of claim 6, wherein charge is added to a capacitor connected to the reference signal dependent on at least one of the charge of the first capacitor and the charge of the second capacitor.

9. The computer system of claim 1, wherein the second circuit is digital.

10. A computer system, comprising:
    a first bipolar device;
    a second bipolar device, wherein a CTAT voltage and a PTAT voltage are dependent on current flow through the first bipolar device and current flow through the second bipolar device;
    a digital amplifier having a first input operatively connected to the CTAT voltage and a second input operatively connected to the PTAT voltage, the digital amplifier configured to generate a first digital signal and a second digital signal; and
    a charge pump having a first input operatively connected to the first digital signal and a second input operatively connected to the second digital signal, the charge pump configured to adjust a reference signal,
    wherein the current flow through the first bipolar device and the current flow through the second bipolar device is dependent on the reference signal.

11. The computer system of claim 10, further comprising:
    a first capacitor having a charge dependent on the first digital signal;
    a second capacitor having a charge dependent on the second digital signal;
    a third capacitor operatively connected to the reference signal, wherein a charge of the third capacitor is dependent on at least one of the first capacitor and the second capacitor.

12. The computer system of claim 10, wherein at least one of the first bipolar device and the second bipolar device is diode-connected.

13. The computer system of claim 10, further comprising:
    a first MOS device having an input operatively connected to the reference signal, the first MOS device having a terminal operatively connected to the first bipolar device; and
    a second MOS device having an input operatively connected to the reference signal, the second MOS device having a terminal operatively connected to the second bipolar device.

14. The computer system of claim 13, wherein the CTAT voltage is operatively connected to one of the terminal operatively connected to the first bipolar device and the terminal operatively connected to the second bipolar device, and wherein the PTAT voltage is operatively connected to the other of the terminal operatively connected to the first bipolar device and the terminal operatively connected to the second bipolar device.

15. The computer system of claim 10, the digital amplifier further configured to generate the first digital signal and the second digital signal dependent on a difference between the CTAT voltage and the PTAT voltage.

16. A method of generating a reference signal, comprising:
    generating a CTAT voltage;
    generating a PTAT voltage;
    generating a first digital signal and a second digital signal dependent on the CTAT voltage and the PTAT voltage; and
    outputting and adjusting the reference signal dependent on the first digital signal and the second digital signal,
    wherein generating the CTAT voltage and generating the PTAT voltage are dependent on the reference signal.

17. The method of claim 16, the generating the first digital signal and the second digital signal being dependent on a difference between the CTAT voltage and the PTAT voltage.

18. The method of claim 16, further comprising:
    regulating current flow through a first bipolar device dependent on the reference signal;
    regulating current flow through a second bipolar device dependent on the reference signal; and
    wherein generating the CTAT voltage and generating the PTAT voltage are dependent on the current flow through the first bipolar device and the current flow through the second bipolar device.

19. A method of manufacturing, comprising:

disposing a first device;

disposing a second device, the first device and the second device configured to generate, when in operation, a PTAT voltage on a first disposed wire and a CTAT voltage on a second disposed wire;

disposing a first circuit having a first input operatively connected to the first disposed wire and a second input operatively connected to the second disposed wire, the first circuit configured to generate, when in operation, a first digital signal on a third disposed wire and a second digital signal on a fourth disposed wire;

disposing a second circuit having a first input operatively connected to the third disposed wire and a second input operatively connected to the fourth disposed wire, the second circuit configured to generate, when in operation, a reference signal on a fifth disposed wire, wherein a terminal of the first device and a terminal of the second device are operatively connected to the fifth disposed wire.

20. The method of claim 19, wherein the first circuit is configured to generate, when in operation, the first digital signal on the third disposed wire and the second digital signal on the fourth disposed wire dependent on a difference between the PTAT voltage and the CTAT voltage.

* * * * *